United States Patent
Snyder et al.

(10) Patent No.: US 11,755,791 B2
(45) Date of Patent: *Sep. 12, 2023

(54) AIRCRAFT COMPONENT QUALIFICATION SYSTEM AND PROCESS

(71) Applicant: Raytheon Technologies Corporation, Farmington, CT (US)

(72) Inventors: Daniel A. Snyder, Manchester, CT (US); David J. Yudichak, Tolland, CT (US); Kurt R. Heinemann, East Hampton, CT (US); Perry Bowes, Manchester, CT (US); Evan Selin, Rocky Hill, CT (US)

(73) Assignee: RTX Corporation, Farmington, CT (US)

(*) Notice: Subject to any disclaimer, the term of this patent is extended or adjusted under 35 U.S.C. 154(b) by 1238 days.

This patent is subject to a terminal disclaimer.

(21) Appl. No.: 16/026,547

(22) Filed: Jul. 3, 2018

(65) Prior Publication Data
US 2020/0012749 A1    Jan. 9, 2020

(51) Int. Cl.
*G06F 30/20* (2020.01)
*G06F 30/17* (2020.01)
(Continued)

(52) U.S. Cl.
CPC .............. *G06F 30/20* (2020.01); *G06F 30/15* (2020.01); *G06F 30/17* (2020.01); *F05D 2260/81* (2013.01); *G06N 20/00* (2019.01)

(58) Field of Classification Search
CPC ..... G06F 30/20; G06N 20/00; F05D 2260/81; F05D 2230/00; F05D 2270/70;
(Continued)

(56) References Cited

U.S. PATENT DOCUMENTS 6,408,258 B1 *  6/2002  Richer .................. G06Q 10/06
                                                                  702/182
6,802,045 B1  10/2004  Sonderman et al.
(Continued)

FOREIGN PATENT DOCUMENTS

CN      106917641 A     7/2017
EP        1204076       5/2002
(Continued)

OTHER PUBLICATIONS

Principal Component Analysis (PCA) Wikipedia Page https://en.wikipedia.org/wiki/Principal_component_analysis; 30 Pgs; 2022 (Year: 2022).*
(Continued)

*Primary Examiner* — Akash Saxena
(74) *Attorney, Agent, or Firm* — Carlson, Gaskey & Olds, P.C.

(57) ABSTRACT

A qualification system for gas turbine engine components includes a computer system configured to receive a set of measured parameters for each gas turbine engine component in a plurality of substantially identical gas turbine engine components, and determine a variation model based on the set of measured parameters. The computer system includes at least one simulated engine model configured to determine a predicted operation of each gas turbine engine component in the plurality of substantially identical gas turbine engine components, a correlation system configured to correlate variations in the set of parameters for each of the gas turbine engine components with a set of the predicted operations of each gas turbine engine, thereby generating a predictive model based on the variations. The computer system also includes a qualification module configured to generate a qualification formula based on the predictive model. The qualification formula is configured to receive a set of measured parameters of an as-manufactured gas turbine engine (Continued)

component and determine when the as manufactured gas turbine engine component is qualified for inclusion in at least one engine.

12 Claims, 6 Drawing Sheets

(51) Int. Cl.
*G06F 30/15* (2020.01)
*G06N 20/00* (2019.01)

(58) Field of Classification Search
CPC ............ F05D 2270/71; F05D 2270/11; F05D 2260/80; F05D 2260/82; F05D 2260/821; F01D 5/005; F01D 21/003; F01D 25/00; Y02T 50/60; G01M 15/14; F02C 9/00
See application file for complete search history.

(56) References Cited

U.S. PATENT DOCUMENTS

| | | | |
|---|---|---|---|
| 6,969,821 B2 | 11/2005 | Mika et al. | |
| 7,926,289 B2 | 4/2011 | Lee et al. | |
| 8,306,791 B2* | 11/2012 | Yerramalla | G05B 17/02 703/2 |
| 8,712,739 B2 | 4/2014 | Jiang et al. | |
| 8,788,312 B2* | 7/2014 | Wetzer | G06Q 10/063112 705/7.26 |
| 8,914,265 B2* | 12/2014 | Zhang | G05B 17/02 703/7 |
| 9,816,897 B2 | 11/2017 | Ziarno | |
| 9,818,242 B2 | 11/2017 | Volponi et al. | |
| 10,047,679 B2* | 8/2018 | Jiang | G01M 15/14 |
| 10,311,164 B2* | 6/2019 | Fricero | G05B 19/4097 |
| 10,496,086 B2* | 12/2019 | Garciamoreno | F01D 21/003 |
| 11,170,140 B2* | 11/2021 | Snyder | F01D 25/00 |
| 11,281,821 B2* | 3/2022 | Snyder | G01M 15/14 |
| 11,447,271 B2* | 9/2022 | Somanath | G01M 15/14 |
| 2002/0128790 A1* | 9/2002 | Woodmansee | G06T 7/0006 702/81 |
| 2004/0117152 A1* | 6/2004 | Shafer | G06Q 10/06 702/183 |
| 2005/0234586 A1* | 10/2005 | Agapiou | G05B 19/41875 700/159 |
| 2006/0188374 A1* | 8/2006 | Mickol | F04D 29/662 416/219 R |
| 2006/0212281 A1* | 9/2006 | Mathews | G06F 30/15 703/7 |
| 2008/0015725 A1* | 1/2008 | Eichblatt | G05B 19/41875 700/109 |
| 2008/0027686 A1* | 1/2008 | Mollmann | F01D 5/26 703/2 |
| 2010/0089067 A1* | 4/2010 | Wilkes | G05B 23/0254 703/2 |
| 2010/0257838 A1* | 10/2010 | Mazzaro | G05B 13/028 702/184 |
| 2012/0116736 A1* | 5/2012 | Friedberg | G06F 30/15 703/2 |
| 2014/0208768 A1 | 7/2014 | Bacic | |
| 2014/0358500 A1* | 12/2014 | Morris | G06F 30/17 703/2 |
| 2015/0322789 A1* | 11/2015 | Pandey | G01M 15/14 702/34 |
| 2017/0132777 A1 | 5/2017 | Durrant et al. | |
| 2017/0315537 A1* | 11/2017 | Singh | G05B 19/4097 |
| 2017/0323274 A1* | 11/2017 | Johnson | G05B 13/041 |
| 2017/0323403 A1* | 11/2017 | Johnson | G06Q 10/06314 |
| 2017/0350683 A1* | 12/2017 | Bather | F01D 5/12 |
| 2018/0164796 A1* | 6/2018 | Garciamoreno | F01D 21/003 |
| 2018/0211336 A1* | 7/2018 | Schwarz | G01M 15/14 |
| 2018/0283278 A1* | 10/2018 | Adibhatla | F01D 11/24 |
| 2018/0284737 A1* | 10/2018 | Celia | G06N 3/0472 |
| 2019/0146470 A1* | 5/2019 | Akkaram | G05B 23/0254 700/30 |
| 2019/0156600 A1* | 5/2019 | Potyrailo | G07C 5/0816 |
| 2020/0012749 A1* | 1/2020 | Snyder | F01D 25/00 |
| 2020/0079532 A1* | 3/2020 | Rix | G01C 23/00 |
| 2020/0317370 A1* | 10/2020 | Somanath | B64F 5/60 |
| 2020/0317371 A1* | 10/2020 | Somanath | G01M 15/14 |
| 2021/0157312 A1* | 5/2021 | Celia | G05B 23/0286 |

FOREIGN PATENT DOCUMENTS

| | | |
|---|---|---|
| EP | 1494003 | 1/2005 |
| GB | 2536628 A | 9/2016 |
| RU | 2016115404 A | 10/2017 |
| WO | 2005013070 | 2/2005 |
| WO | 2013127958 | 9/2013 |

OTHER PUBLICATIONS

The European Search Report for EP Application No. 19183852.3, dated Dec. 10, 2019.
Eger, Florian et al.. Part Variation Modeling in Multi-Stage Production Systems for Zero-Defect Manufacturing, 2019 IEEE International Conference on Industrial Technology, Feb. 13, 2019, pp. 1017-1022.
Brown, Jeffrey M. and Ramana V. Grandhi, Reduced-Order Model Development for Airfoil Forced Response, International Journal of Rotating Machinery, Jul. 9, 2007, pp. 1-12, vol. 2008, Article ID 387828, Hindawi Publishing Corporation.
U.S. Appl. No. 15/956,884, filed Apr. 19, 2018.

* cited by examiner

AIRCRAFT COMPONENT QUALIFICATION SYSTEM AND PROCESS

TECHNICAL FIELD

The present disclosure relates generally to a process for qualifying manufactured gas turbine engine components, and more specifically to a process for qualifying individual airfoil components.

BACKGROUND

Gas turbine engines, such as those utilized in commercial and military aircraft, include a compressor section that compresses air, a combustor section in which the compressed air is mixed with a fuel and ignited, and a turbine section across which the resultant combustion products are expanded. The expansion of the combustion products drives the turbine section to rotate. As the turbine section is connected to the compressor section via one or more shaft, the rotation of the turbine section further drives the compressor section to rotate. In some examples, a fan is also connected to the shaft and is driven to rotate via rotation of the turbine as well.

Any given gas turbine engine is constructed of a significant number of individually manufactured components. Among the individually manufactured components can be blades, vanes, panels, outer air seals, and the like. In some cases, such as with a compressor rotor or a fan, multiple substantially identical components can be utilized in a single engine assembly. During manufacture of such components it is possible for one or more parameter of the component to be out of specification, resulting in a sub-optimal or an unusable component.

SUMMARY OF THE INVENTION

In one exemplary embodiment a qualification system for gas turbine engine components includes a computer system configured to receive a set of measured parameters for each gas turbine engine component in a plurality of substantially identical gas turbine engine components, and determine a variation model based on the set of measured parameters, the computer system including at least one simulated engine model, the simulated engine model being configured to determine a predicted operation of each gas turbine engine component in the plurality of substantially identical gas turbine engine components, a correlation system configured to correlate variations in the set of parameters for each of the gas turbine engine components in the plurality of substantially identical gas turbine engine components with a set of the predicted operations of each gas turbine engine component in the plurality of substantially identical gas turbine engine components, thereby generating a predictive model based on the variations, and a qualification module configured to generate a qualification formula based on the predictive model, wherein the qualification formula is configured to receive a set of measured parameters of an as-manufactured gas turbine engine component and determine when the as manufactured gas turbine engine component is qualified for inclusion in at least one engine.

In another example of the above described qualification system for a gas turbine engine the plurality of substantially identical gas turbine engine components are manufactured via a single manufacturing process.

In another example of any of the above described qualification systems for a gas turbine engine the qualification formula is configured to qualify an as-manufactured gas turbine engine component manufactured via the single manufacturing process.

In another example of any of the above described qualification systems for a gas turbine engine the plurality of substantially identical gas turbine engine components includes at least 25 substantially identical turbine engine components.

In another example of any of the above described qualification systems for a gas turbine engine the plurality of substantially identical gas turbine engine component includes at least 200 substantially identical turbine engine components.

In another example of any of the above described qualification systems for a gas turbine engine the qualification formula is a set of mathematical functions, each of which relates at least two parameters of the set of measured parameters for each gas turbine engine component.

In another example of any of the above described qualification systems for a gas turbine engine the qualification formula is configured to determine when the as manufactured gas turbine engine component is qualified for inclusion in at least two engines.

In another example of any of the above described qualification systems for a gas turbine engine the at least two engines are distinct engine types.

In another example of any of the above described qualification systems for a gas turbine engine the at least two engines are distinct assemblies of a single engine type.

In another example of any of the above described qualification systems for a gas turbine engine the qualification module is configured to compare the outputs of the qualification formula to a qualification table and determine that the as-manufactured part is qualified for the at least one engine when each of the outputs fall within a set of ranges defined in the qualification table.

In another example of any of the above described qualification systems for a gas turbine engine the qualification module is configured to provide a qualification status of the as-manufactured gas turbine engine component to a manufacturing system in response to the as manufactured gas turbine engine component being qualified for inclusion in the at least one engine, and wherein the manufacturing system is configured to at least partially install the as-manufactured gas turbine engine component in the at least one engine.

An exemplary method for qualifying a gas turbine engine component includes training a qualification formula via receiving a set of measured parameters for each gas turbine engine component in a plurality of substantially identical gas turbine engine components, generating a variation model of the plurality of substantially identical gas turbine engine components, determining a simulated response of each of the gas turbine engine components within a simulated engine model, and correlating variations in the set of parameters for each of the gas turbine engine components in the plurality of substantially identical gas turbine engine components with a set of the predicted operations of each gas turbine engine component in the plurality of substantially identical gas turbine engine components, thereby generating a predictive model based on the variations, and qualifying a second gas turbine engine component for at least one engine by providing a set of measured parameters of the gas turbine engine component to the qualification formula, comparing a plurality of outputs from the qualification formula to a qualification table, and determining that the second gas turbine engine component is qualified for the at least one engine when the each output in the plurality of outputs falls within a first set of ranges defined in the qualification table.

Another example of the above described method for qualifying a gas turbine engine component further includes installing the second gas turbine engine component in an engine after the gas turbine engine component has been qualified.

In another example of any of the above described methods for qualifying a gas turbine engine component the plurality of substantially identical gas turbine engine components includes at least 25 gas turbine engine components.

In another example of any of the above described methods for qualifying a gas turbine engine component each of the gas turbine engine components in the plurality of substantially identical gas turbine engine components is manufactured using a single manufacturing process.

In another example of any of the above described methods for qualifying a gas turbine engine component the second gas turbine engine component is manufactured using the single manufacturing process.

In another example of any of the above described methods for qualifying a gas turbine engine component the qualification formula includes a set of mathematical functions, each of which relates at least two parameters of the set of measured parameters for each gas turbine engine component.

In another example of any of the above described methods for qualifying a gas turbine engine component the qualification formula is configured to determine when the second gas turbine engine component is qualified for inclusion in at least two engines by the qualification formula.

In another example of any of the above described methods for qualifying a gas turbine engine component the at least two engines are distinct engine types.

In another example of any of the above described methods for qualifying a gas turbine engine component the at least two engines are distinct assemblies of a single engine type.

Another example of any of the above described methods for qualifying a gas turbine engine component further includes identifying the second gas turbine engine component as eligible for at least one of reworking and manual review when the each output in the plurality of outputs falls within a second set of ranges defined in the qualification table.

In another example of any of the above described methods for qualifying a gas turbine engine component further includes reworking the second gas turbine engine component in response to the second gas turbine engine component being identified as eligible for at least one of reworking and manual review.

These and other features of the present invention can be best understood from the following specification and drawings, the following of which is a brief description.

DETAILED DESCRIPTION OF AN EMBODIMENT

Figure 1:
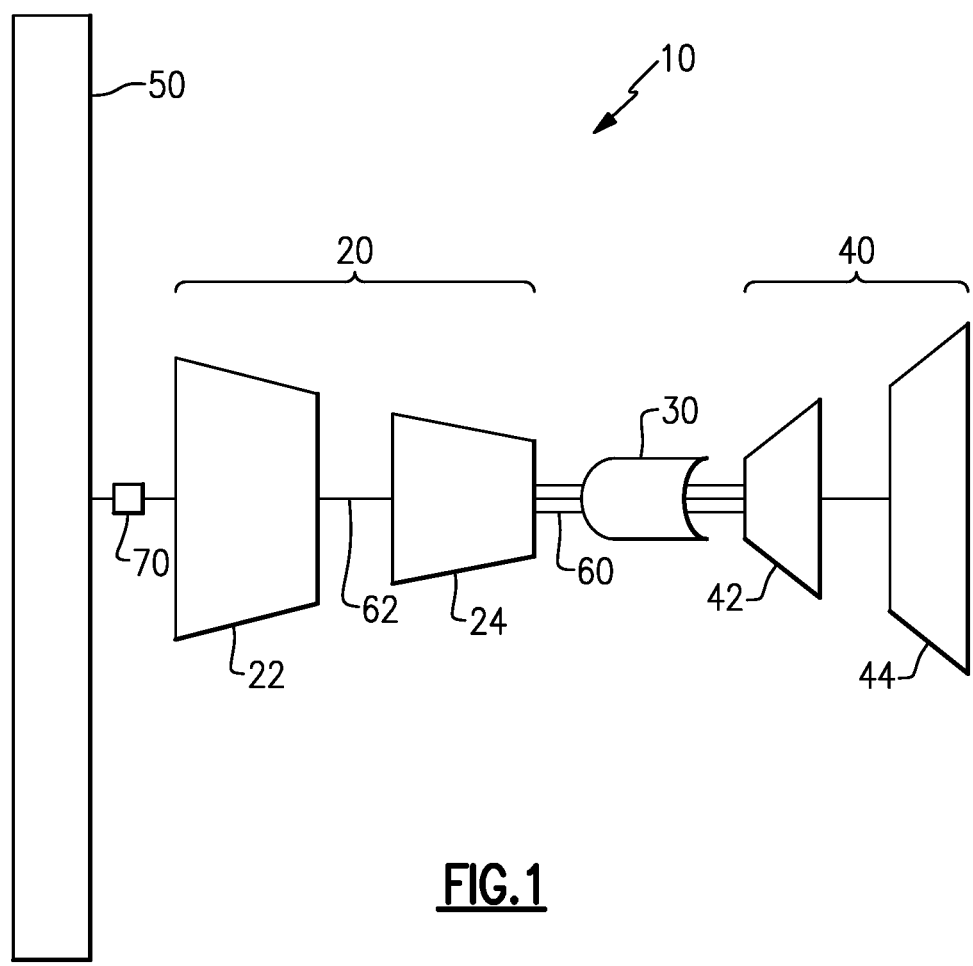
FIG. 1 illustrates a high level schematic view of an exemplary gas turbine engine.

FIG. 1 schematically illustrates a gas turbine engine 10 including a compressor section 20, a combustor section 30, and a turbine section 40. Positioned fore of the compressor section 20 is a fan 50. The compressor section 20 includes a low pressure compressor 22 and a high pressure compressor 24. Similarly, the turbine section 40 includes a high pressure turbine 42 and a low pressure turbine 44. The high pressure turbine 42 is connected to the high pressure compressor 24 via a first shaft 60 and rotation of the high pressure turbine 42 drives rotation of the high pressure compressor 24. Similarly, the low pressure compressor 22 is connected to the low pressure turbine 44 via a second shaft 62 and the rotation of the low pressure turbine 44 drives rotation of the low pressure compressor 22. In the example engine 10 of FIG. 1, the fan 50 is connected to, and driven by, the first shaft 62 via a gear system 70.

One of skill in the art will appreciate that in alternative examples, an alternative number of turbines 42, 44 and compressors 22, 24 can be utilized and still achieve similar results. Similarly, the fan 50 can be driven via a direct connection to the shaft 62 instead of the geared system 70, or driven in any other known manner.

Each of the fan 50, the compressors 22, 24 and the turbines 42, 44 are constructed from multiple substantially identical components which can include rotor blades, vanes, blade outer air seals, and the like. Each component is constructed according to a set of multiple design parameters. Each of those design parameters is given a range of acceptable values to account for manufacturing variations, as well as tolerances with the engine structure.

Existing component qualification systems determine the as-manufactured dimensions of each manufactured component, compare the measured dimensions of the manufactured component to the design dimensions, including tolerances, and determine that the component is "acceptable" when every parameter falls within the as designed specification. The type of manufacturing process used to make the part, and the relationship between each measured parameter and each other measured parameter is not included within the existing analysis. In some examples, such as those where the manufacture of each component is particularly expensive, unqualified components are manually reviewed to determine if the component may still be acceptable for use within an engine despite including one or more parameter that is outside of the as designed tolerances. In alternative examples, the unqualified component can be scrapped or reworked to meet tolerances.

Figure 2A:
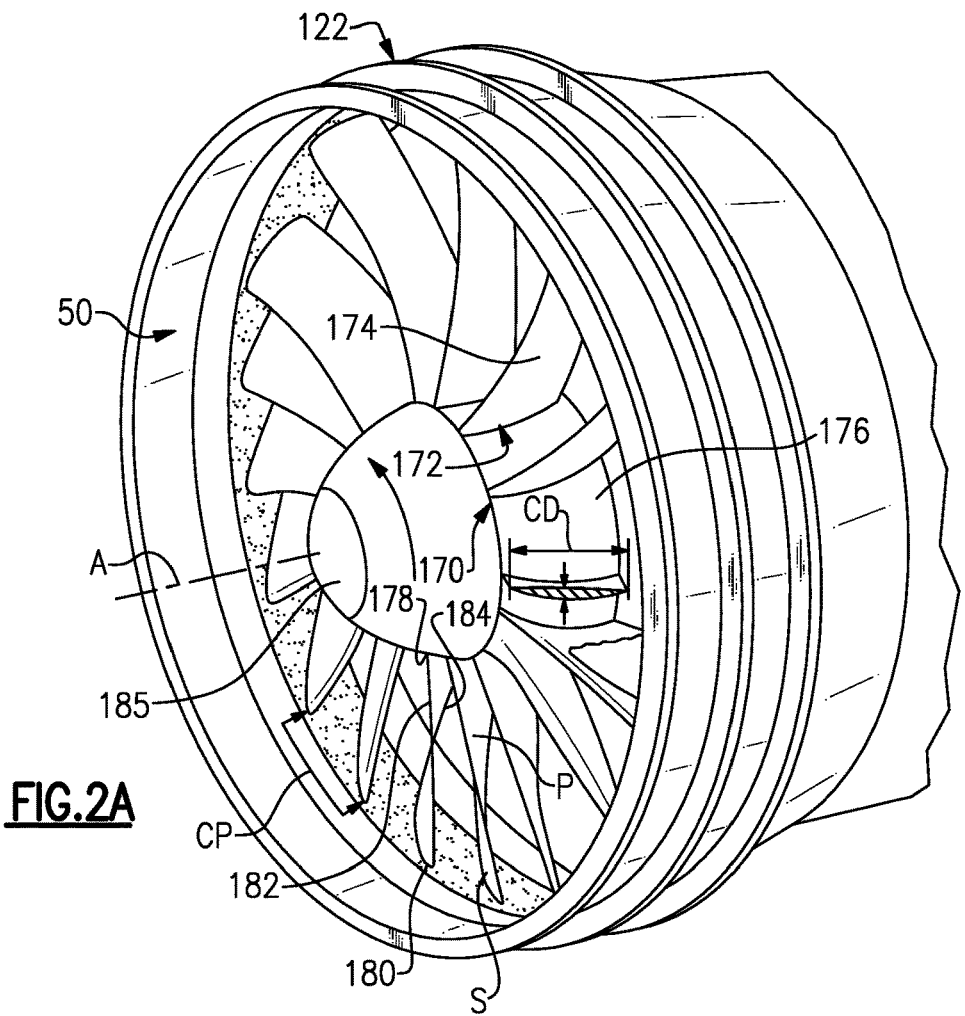
FIG. 2A is a perspective view of a fan section of the engine of FIG. 1.
Figures 2B, 2C:
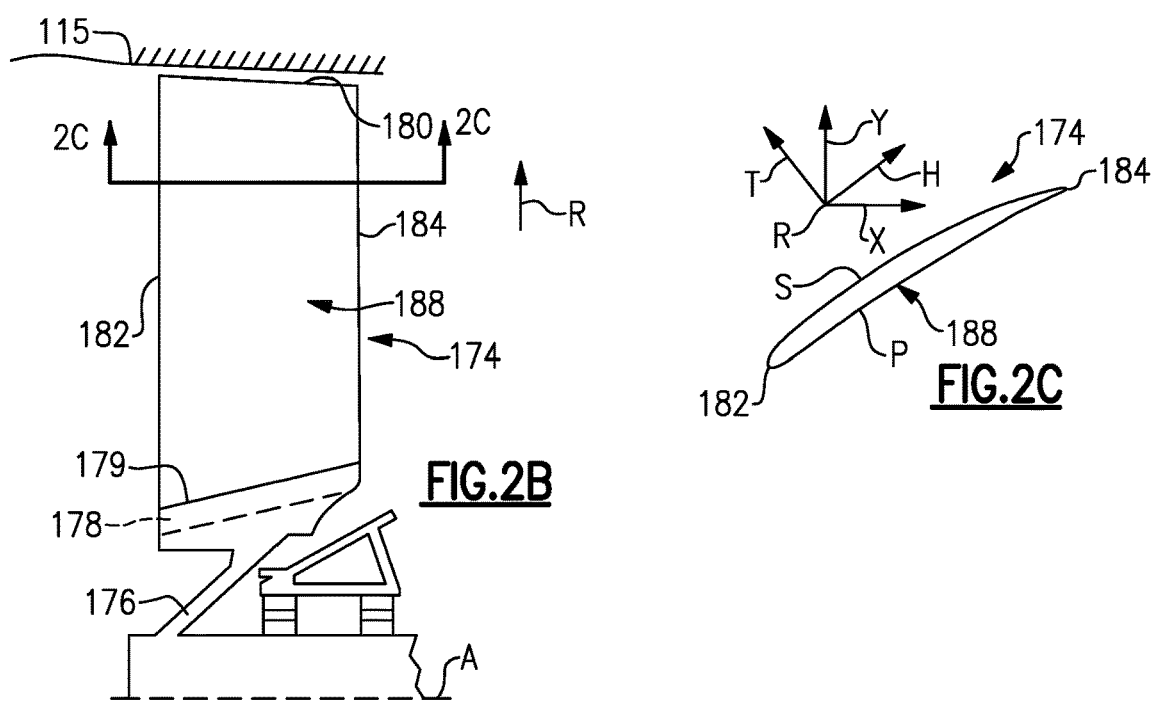
FIG. 2B is a schematic cross-sectional view of the fan section of FIG. 2A.
FIG. 2C is a schematic view of a cross-section of an airfoil of FIG. 2B sectioned at a particular span position and depicting directional indicators.

One such structure in the example of FIG. 1 is the fan 50. Referring to FIGS. 2A-2C, the fan 50 includes a rotor 170 having an array or row 172 of airfoils or blades 174 that extend circumferentially around, and are supported by, the fan hub 176. Any suitable number of fan blades 174 may be used in a given application. The hub 176 is rotatable about the engine axis A. The array 172 of fan blades 174 are positioned about the axis A in a circumferential or tangential direction Y. Each of the blades 174 includes an airfoil body that extends in a radial span direction R from the hub 176 between a root 178 and a tip 180, in a chord direction H (axially and circumferentially) between a leading edge 182 and a trailing edge 184 and in a thickness direction T between a pressure side P and a suction side S.

Each blade 174 has an exterior surface 188 providing a contour that extends from the leading edge 182 aftward in a chord-wise direction H to the trailing edge 184. The exterior surface 188 of the fan blade 174 generates lift based upon its geometry and directs flow along the core flow path and bypass flow path. The fan blade 174 may be constructed from a composite material, or an aluminum alloy or titanium alloy, or a combination of one or more of these. Abrasion-resistant coatings or other protective coatings may be applied to the fan blade 174.

A chord, represented by chord dimension (CD), is a straight line that extends between the leading edge 182 and the trailing edge 184 of the blade 174. The chord dimension (CD) may vary along the span of the blade 174. The row 172 of blades 174 also defines a circumferential pitch (CP) that is equivalent to the arc distance between the leading edges 182 or trailing edges 184 of neighboring blades 174 for a corresponding span position. The root 178 is received in a correspondingly shaped slot in the hub 176. The blade 174 extends radially outward of a platform 179, which provides the inner flow path. The platform 179 may be integral with the blade 174 or separately secured to the hub 176, for example. A spinner 185 is supported relative to the hub 176 to provide an aerodynamic inner flow path into the fan section 122.

Figure 3A:
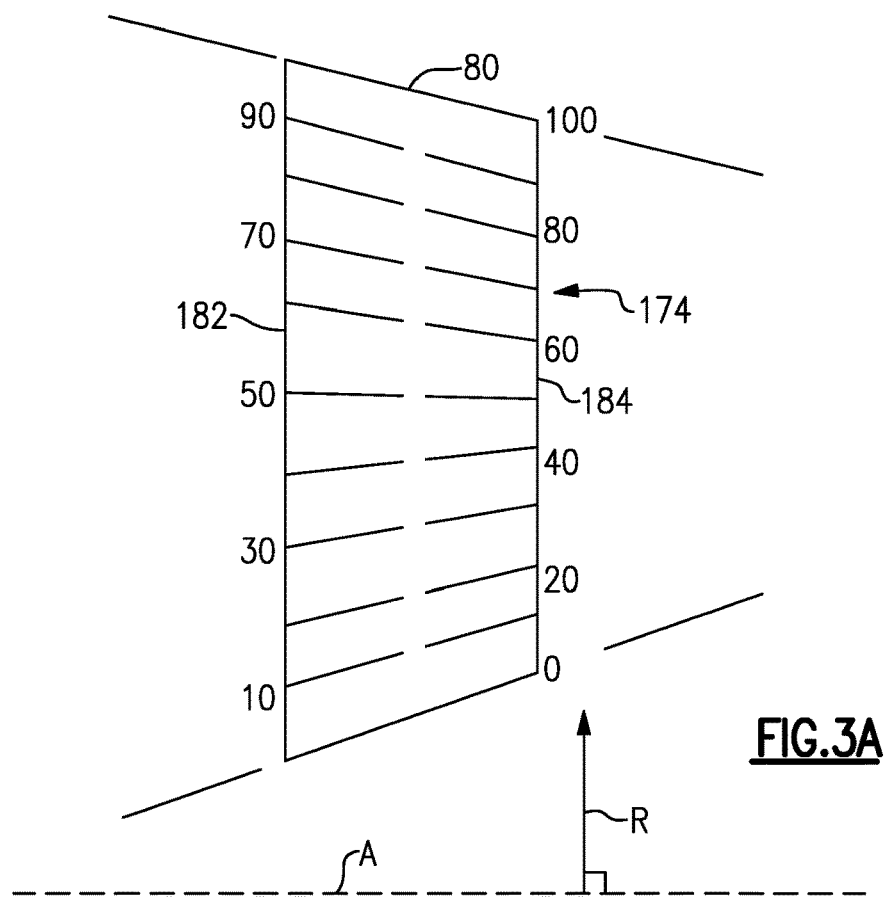
FIG. 3A is a schematic view of airfoil span positions.
Figure 3B:
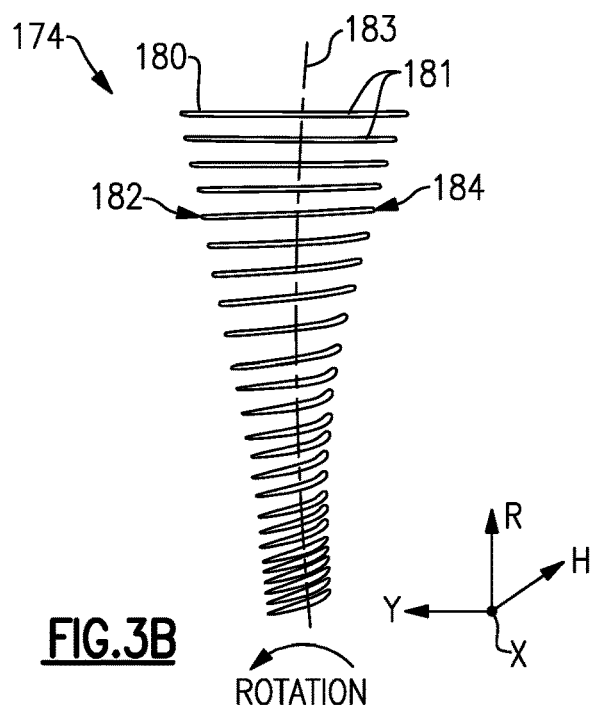
FIG. 3B is a perspective view of sections of the airfoil of FIG. 2A at various span positions.

Referring to FIGS. 3A-3B, span positions are schematically illustrated from 0% to 100% in 10% increments to define a plurality of sections 181. Each section at a given span position is provided by a conical cut that corresponds to the shape of segments the bypass flowpath or the core flow path, as shown by the large dashed lines (shown in FIG. 3A). In the case of a fan blade 174 with an integral platform, the 0% span position corresponds to the radially innermost location where the airfoil meets the fillet joining the airfoil to the platform 179. In the case of a fan blade 174 without an integral platform, the 0% span position corresponds to the radially innermost location where the discrete platform 179 meets the exterior surface of the airfoil (shown in FIG. 2B). A 100% span position corresponds to a section of the blade 174 at the tip 80.

In some examples, each of the blades 174 defines a non-linear stacking axis 183 (shown in FIG. 3B) in the radial direction R between the tip 180 and the inner flow path location or platform 179. For the purposes of this disclosure, "stacking axis" refers to a line connecting the centers of gravity of airfoil sections 181. In some examples, each fan blade 174 is specifically twisted about a spanwise axis in the radial direction R with a corresponding stagger angle at each span position and is defined with specific sweep and/or dihedral angles along the airfoil 174. Airfoil geometric shapes, stacking offsets, chord profiles, stagger angles, sweep and dihedral angles, and surface shape in an X, Y, Z coordinate system, among other associated features, can be incorporated individually or collectively to improve characteristics such as aerodynamic efficiency, structural integrity, and vibration mitigation, for example.

Figure 3C:
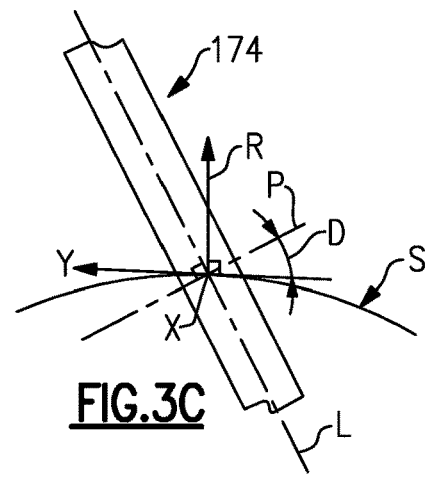
FIG. 3C is a schematic representation of a dihedral angle for an airfoil.

In some examples, the airfoil 174 defines an aerodynamic dihedral angle D (simply referred to as "dihedral") as schematically illustrated in FIG. 3C. An axisymmetric stream surface S passes through the airfoil 174 at a location that corresponds to a span location (FIG. 3A). For the sake of simplicity, the dihedral D relates to the angle at which a line L along the leading or trailing edge tilts with respect to the stream surface S. A plane P is normal to the line L and forms an angle with the tangential direction Y, providing the dihedral D. A positive dihedral D corresponds to the line tilting toward the suction side (suction side-leaning), and a negative dihedral D corresponds to the line tilting toward the pressure side (pressure side-leaning).

As can be seen, each individual fan blade 174 defines multiple parameters such as chord dimension, radial span length, thickness, contour, circumferential pitch, stacking axis, stagger angle, sweep angle, and dihedral angle. Further, many of the example parameters as well as additional parameters can be required to meet tolerances at each of multiple span positions resulting in a substantial number of parameters, any one of which can disqualify the fan blade 174 if it is out of tolerance range under existing manufacturing processes. While described above with regards to the fan 50, and individual fan blades 174, it should be understood that similar parameters exist for any given blade and/or vane utilized through the engine 10, including those within the compressor section 20, and the turbine section 40. Further, any number of other engine components can have similar numbers of parameters, all of which must be within tolerance, even if they parameters of the given component are not the same as the airfoil parameters described above.

Under current manufacturing processes, if any of the above described parameters, or any similar parameters that may be necessary for a given component, are out of tolerance at any single point the component will fail inspection (be disqualified) and either scrapped or provided to an engineering team for manual review. Further it should be understood that the above described parameters are merely exemplary parameters of a fan blade 174, and practical components can include more and different parameters that are subjected to the same level of analysis when qualifying the component.

With reference to each of FIGS. 1-3C, disclosed herein is an improved system and process for qualifying manufactured parts based on the totality of the part configuration, rather than individually based on each parameter at each location on the component. In some examples, one or more parameter may be out of tolerance, but when the component is considered as a whole it will still be an acceptable configuration. Further exacerbating this is the fact that different manufacturing techniques for any given component (e.g. additive manufacturing vs. casting) can result in different acceptable configurations that may include one or more parameter outside of the as designed tolerances.

With continued reference to FIGS. 1-3C, FIG. 4 schematically illustrates an exemplary system 300 for developing and analyzing a batch of manufactured parts in order to qualify individual parts. Initially a batch of parts are manufactured using a single manufacturing process or uniform combination of processes in a manufacture parts step 310. Once a full batch of the parts has been manufactured, each parameter of each of the parts is measured in an inspect parts step 320. The output of the inspect parts step 320 is a data set that includes a measurement of each parameter of each part in the manufacturing run. The as-manufactured data set is then provided to a computer system and is used by the computer system to train a part analysis in a "train analysis system" step 330 within the train analysis step 330. The computer system develops a variance model that models the variations of an average, or exemplary part, for the specific manufacturing process or processes based on the set of as measured manufactured parts. Contemporaneously with the variance model, the computer system develops a predictive model, that can predict the behavioral characteristics, such as efficiency, bending, vibration, etc. of a given blade based on the specific parameters of that blade and the engine in which the blade is to be included.

The variation model is a dimension reducing model, and describes a large number of observable variables' values using a smaller number of independent, latent variables. A latent variable is a variable whose value depends on our understanding of the latent structure inside the observed data. The latent structure of the data can only be determined from correlation analysis of the observed variables, and the correlation analysis requires observations of multiple as-manufactured parts. The usage of the as-manufactured measurements of the batch of components to create the variance model and the predictive model can be referred to as a principal component analysis (PCA). In some examples, the predictive model is a Gaussian Process (GP) model.

Based on the predictive model, and the variance model, the computer system then creates a qualification formula in a "create qualification formula" step 340. The qualification formula is a function, or set of functions, that define an acceptable component based on all of its parameters instead of being based on each parameter's individual tolerances. Due to the number of parameters (in some cases the number of parameters can exceed 20), and the number of positions on the part where that parameter is to be measured, the function(s) determined by the computer system is a high order function, and determining whether an individual component meets the function would be prohibitively time consuming if performed manually.

Figure 4:
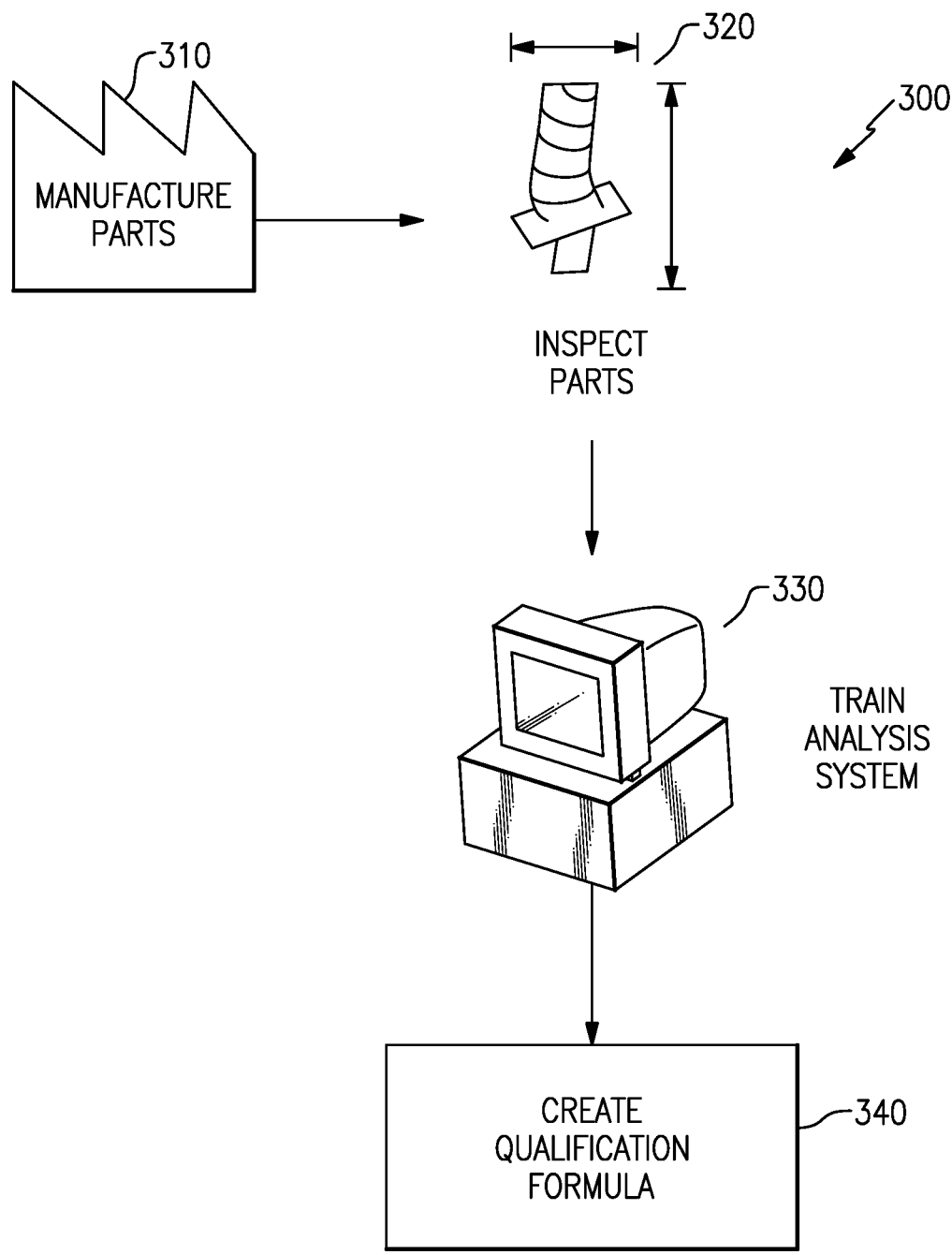
FIG. 4 schematically illustrates an exemplary system for developing and analyzing a batch of manufactured parts in order to qualify individual parts.

With continued reference to FIGS. 1-4, FIG. 5 schematically illustrates the "train analysis" step 330 of FIG. 4. Initially, during the train analysis step 330, the computer system receives all of the measured parameters of each component in the batch in a receive measured parameters step 410. In some examples, the computer system can further determine one or more derived parameter based on a combination or manipulation of one or more of the measured parameters.

The full data set is passed to a generate variation model operation 420 and a run simulation on components operation 430. During the generate variation model step 420, the computer system determines a single variation model representative of the possible and/or expected variations of the specified component producible using the given manufacturing process. The variation model is representative of the as-manufactured components in the entirety of the batch. The variation model can include an average figure, standard deviations, tolerances, and the like and be determined using any known process.

During the run simulation on components process 430, the computer system iteratively runs a simulation where each of the components as-manufactured is incorporated into a simulated engine, and a computer simulation is run to determine how the as-manufactured component is expected to operate within a mathematical model of the engine. The results of the simulation for each as-manufactured component are compared and the variations in the parameters between each as-manufactured component and each other as-manufactured component are correlated with variations in the operation of the corresponding simulation results.

Once the simulation results are completed, the process moves to a combine to predictive model step 440. The correlated variations from simulation results are applied to the variation model generated in the generate variation model step 420 in order to determine a predictive model. The predictive model includes a mathematical function describing how any component fitting the variation model is expected to function within the simulation without requiring a technician to run the full simulation. In some examples, the predictive model can include a Gaussian process. Once generated, the predictive model is output to the computer system in an output predictive model step 450.

Once the predictive model has been output to the computer system, the computer system uses the predictive model to create a qualification formula which can be used to qualify individual components created using the same manufacturing process as the set of components used to train the analysis. As used herein "qualification" of a component refers to determining if the component, as-manufactured, can be utilized in a given engine, must be reworked, or must be scrapped. In some examples, the qualification can include determining which of multiple possible engines the component can be used in, in addition to determining whether the component should be accepted, scrapped or reworked. The qualification formula includes one or more mathematical functions, each of which relates multiple parameters of the as-manufactured component to each other and generates a corresponding output value. In a typical example each of the functions within the qualification formula will be a higher order function.

As described herein, the train analysis step 330 utilizes a set of manufactured components, all of which are manufactured using the same manufacturing process. In some examples, the set of manufactured components includes at least 25 manufactured and analyzed components. In further examples, such as ones where the system may need a greater level of accuracy in the qualification process, at least 200 manufactured and analyzed components can be utilized. In yet further examples, where additional training of the analysis is desired, an initial set of as-manufactured components can be supplemented with components manufactured using the same process in a later manufacturing run.

Figure 5:
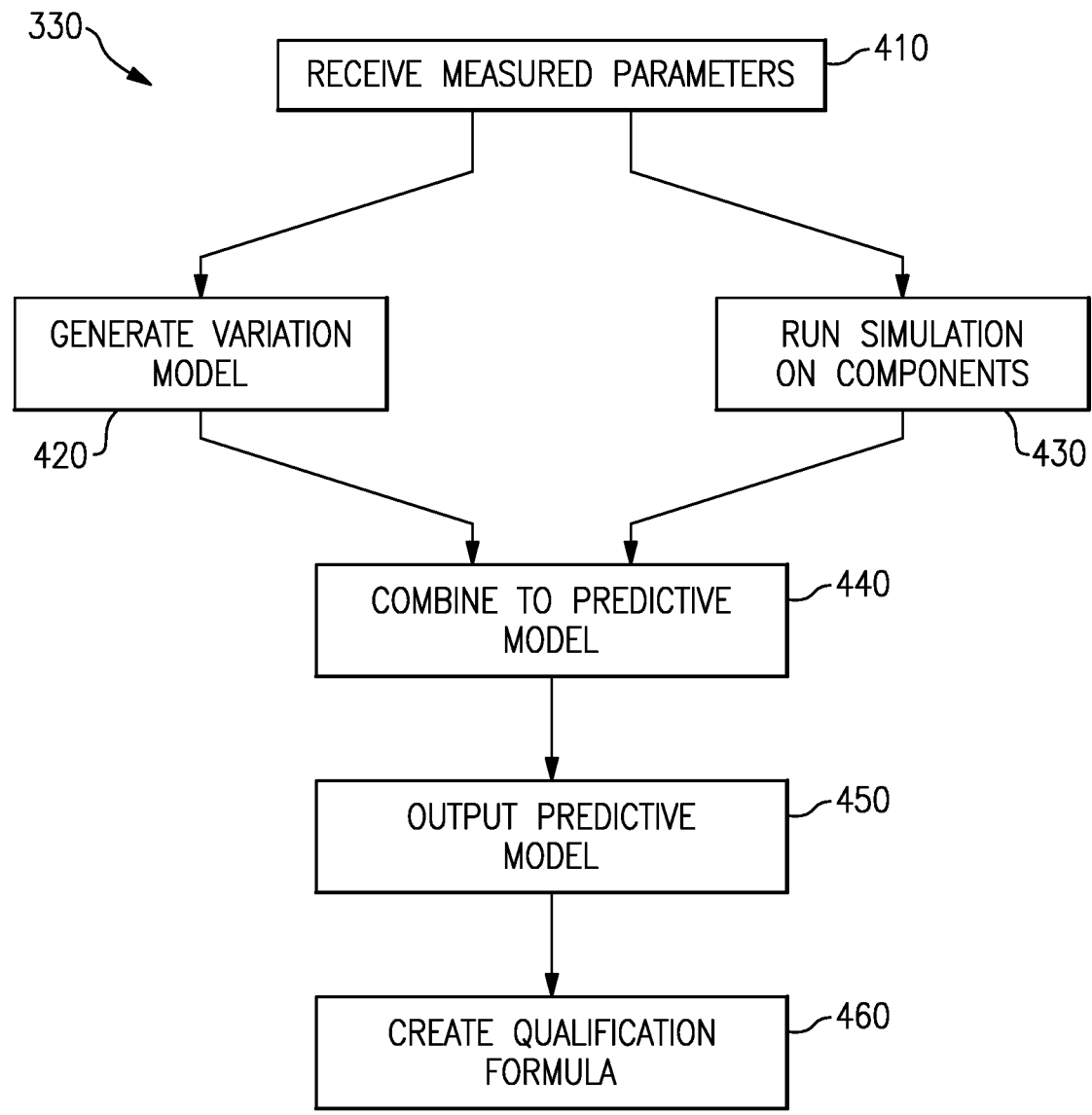
FIG. 5 schematically illustrates a train analysis step for utilization in the process of FIG. 4
Figure 6:
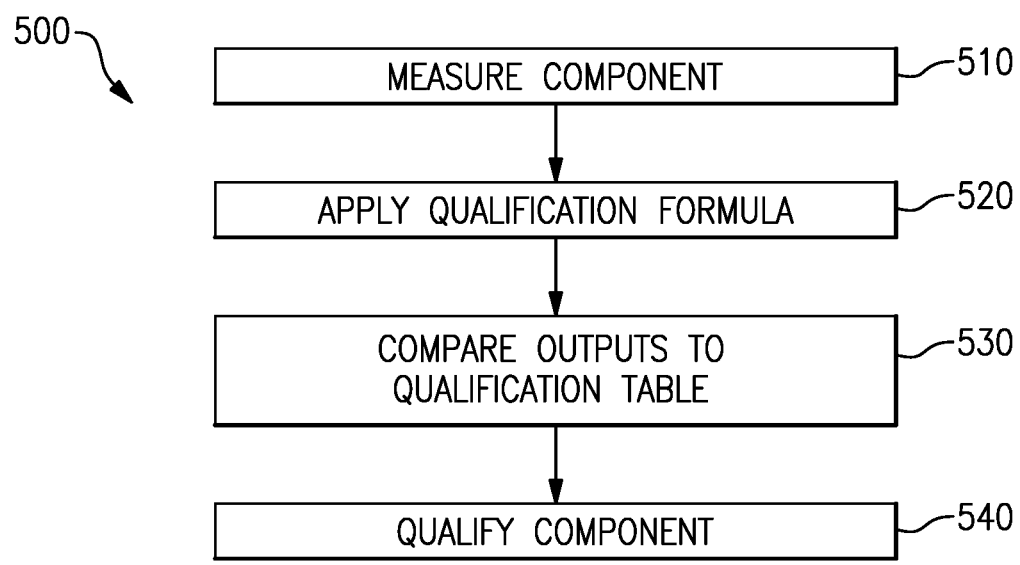
FIG. 6 schematically illustrates a qualification process for qualifying an aircraft component.

With continued reference to FIG. 5, FIG. 6 schematically illustrates a qualification process 500 utilizing the qualification formula determined during the final step of the train analysis process of FIG. 4. Initially, the individual component being qualified is measured in the same manner as the components used to train the system in a measure component step 510. The measurement determines a measured value of each parameter of the component. The measured parameters are then applied to the qualification formula in an apply qualification formula step 520. Operating the formula using the measured parameters results in a number of outputs, with the number of outputs being equal to the number of functions within the qualification formula. Each output represents a predicted performance result of a relationship between two or more of the measured parameters.

All of the outputs together form a qualification value set of the measured component, and the qualification value set is compared with a qualification table in a compare outputs to qualification table step 530. In one example the qualification table includes a range of qualifying values for each function within the qualification formula, and when each output is within the listed range, as determined in the comparison step 530, the component is qualified for the engine in a qualify component step 540. Alternatively, if any one of the values is outside of the range included within the qualification table, the component is disqualified for the engine.

In some examples, the qualification table can include multiple entries, each corresponding to a different engine and/or a different set of requirements for the engine. In such an example, a component may qualify for the first set of engine requirements, but not for the second set of engine requirements. When such is the case, the system identifies that the component is qualified for the first set and not the second set. Further, in some examples a disqualified component need not necessarily be scrapped. Instead, a set of output values or ranges can be included in the table which indicate that the component is eligible for reworking and/or manual review for qualification.

By using the process described herein, the number of blades that can be qualified without requiring additional engineering analysis can be increased, thereby reducing the time and expenditure required to qualify parts, as well as further reducing waste or scrap parts by decreasing the number of components that are disqualified.

It is further understood that any of the above described concepts can be used alone or in combination with any or all of the other above described concepts. Although an embodiment of this invention has been disclosed, a worker of ordinary skill in this art would recognize that certain modifications would come within the scope of this invention. For that reason, the following claims should be studied to determine the true scope and content of this invention.

The invention claimed is:

1. A qualification system for gas turbine engine components comprising a computer system comprising:
   a processor; and
   a non-transitory memory storing instructions that, when executed by the processor, cause the processor to perform operations comprising:
   receiving a set of measured parameters for each gas turbine engine component of a plurality of same gas turbine engine components, wherein the plurality of same gas turbine engine components consists of one of a first batch of components manufactured using a single manufacturing process OR a second batch of components manufactured using a uniform combination of processes and wherein the set of measured parameters comprises at least an airfoil geometric shape, stacking offset, chord profile, stagger angle, sweep angle, dihedral angle, and surface shape in an X, Y, Z coordinate system, and wherein at least a portion of the parameters are measured at multiple span positions;
   generating, based on the set of measured parameters, a variation model configured to identify variations of each gas turbine engine component as compared to the plurality of same gas turbine engine components, wherein the variation model is a model of the variations on an average part manufactured using the one of the single manufacturing processes and the uniform combination of processes;
   determining expected operational parameters of each gas turbine engine component based on a simulation of each gas turbine engine component of the plurality of same gas turbine engine components operating in a gas turbine environment;
   generating a predictive model based on correlations between the expected operational parameters and the variations associated with respective gas turbine engine components, the predictive model configured to provide an output comprising an operational behavior associated with each gas turbine engine component operating in a gas turbine engine;
   receiving measured, as-manufactured physical parameters of a new component, the new component being separate from, but a same type as, the plurality of same gas turbine engine components, wherein the new component is manufactured using a same manufacturing process as the plurality of same gas turbine engine components;
   determining, based on the predictive model, whether the new component satisfies qualification criteria to be incorporated in the gas turbine engine; and
   performing at least one of:
      based on a determination that the new component satisfies the qualification criteria, determine that the new component is acceptable for incorporation in the gas turbine engine; or
      based on a determination that the new component does not satisfy the qualification criteria, determine that the new component is not acceptable for incorporation in the gas turbine engine.

2. The qualification system of claim 1, wherein the plurality of same gas turbine engine components are manufactured via a single manufacturing process.

3. The qualification system of claim 1, wherein the plurality of same gas turbine engine components includes at least 25 identical turbine engine components.

4. The qualification system of claim 3, wherein the plurality of same gas turbine engine component includes at least 200 identical turbine engine components.

5. The qualification system of claim 1, wherein determining, based on the predictive model, whether the new component satisfies qualification criteria to be incorporated in the gas turbine engine comprises applying the measured, as-manufactured physical parameters of the new component to a qualification formula, wherein the qualification formula is a set of mathematical functions, each of which relates at least two parameters of the set of measured parameters for each gas turbine engine component.

6. The qualification system of claim 1, wherein determining, based on the predictive model, whether the new component satisfies qualification criteria to be incorporated in the gas turbine engine comprises providing a qualification status of the as-manufactured gas turbine engine component to a manufacturing system in response to the as manufactured gas turbine engine component being qualified for inclusion in the at least one engine, and wherein the manufacturing system is configured to at least partially install the as-manufactured gas turbine engine component in the at least one engine.

7. The qualification system of claim 1, wherein the plurality of same gas turbine engine components includes one of gas turbine engine rotors, gas turbine engine vanes, and gas turbine engine blade outer air seals.

8. The qualification system of claim 1, wherein determining, based on the predictive model, whether the new component satisfies qualification criteria to be incorporated in the gas turbine engine includes comparing an output of the predictive model to a qualification table and determining that the component satisfies the qualification criteria in response to the output of the predictive model falling within a predetermined range of outputs within the qualification table.

9. A method for qualifying a gas turbine engine component comprising:
   receiving a set of measured parameters for each gas turbine engine component of a plurality of same gas turbine engine components, wherein the plurality of same gas turbine engine components consists of one of a first batch of components manufactured using a single manufacturing process OR a second batch of components manufactured using a uniform combination of processes and wherein the set of measured parameters comprises at least an airfoil geometric shape, stacking offset, chord profile, stagger angle, sweep angle, dihedral angle, and surface shape in an X, Y, Z coordinate system, and wherein at least a portion of the parameters are measured at multiple span positions;

generating, based on the set of measured parameters, a variation model configured to identify variations of each gas turbine engine component as compared to the plurality of same gas turbine engine components, wherein the variation model is a model of the variations on an average part manufactured using the one of the single manufacturing processes and the uniform combination of processes;

determining expected operational parameters of each gas turbine engine component based on a simulation of each gas turbine engine component of the plurality of same gas turbine engine components operating in a gas turbine environment;

generating a predictive model based on correlations between the expected operational parameters and the variations associated with respective gas turbine engine components, the predictive model configured to provide an output comprising an operational behavior associated with each gas turbine engine component operating in a gas turbine engine;

receiving measured, as-manufactured physical parameters of a new component, the new component being separate from, but a same type as, the plurality of same gas turbine engine components, wherein the new component is manufactured using a same manufacturing process as the plurality of same gas turbine engine components;

determining, based on the predictive model, whether the new component satisfies qualification criteria to be incorporated in the gas turbine engine; and performing at least one of:
  based on a determination that the new component satisfies the qualification criteria, determine that the new component is acceptable for incorporation in the gas turbine engine; or
  based on a determination that the new component does not satisfy the qualification criteria, determine that the new component is not acceptable for incorporation in the gas turbine engine.

10. The method of claim 9, wherein the plurality of same gas turbine engine components includes at least 25 gas turbine engine components.

11. The method of claim 9, wherein determining, based on the predictive model, whether the new component satisfies qualification criteria to be incorporated in the gas turbine engine includes determining a qualification formula, wherein the qualification formula defines a set of mathematical functions, each of which relates at least two parameters of the set of measured parameters for each gas turbine engine component.

12. The method of claim 9, further comprising identifying the new gas turbine engine component as eligible for at least one of reworking and manual review when the new component does not satisfy the qualification criteria.

* * * * *